(12) United States Patent
Noguchi et al.

(10) Patent No.: US 10,510,844 B2
(45) Date of Patent: Dec. 17, 2019

(54) SEMICONDUCTOR DEVICE AND METHOD OF MANUFACTURING SAME

(71) Applicant: Mitsubishi Electric Corporation, Chiyoda-ku (JP)

(72) Inventors: Munetaka Noguchi, Tokyo (JP); Toshiaki Iwamatsu, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/307,088

(22) PCT Filed: Jun. 22, 2017

(86) PCT No.: PCT/JP2017/023023
§ 371 (c)(1),
(2) Date: Dec. 4, 2018

(87) PCT Pub. No.: WO2018/012241
PCT Pub. Date: Jan. 18, 2018

(65) Prior Publication Data
US 2019/0229191 A1 Jul. 25, 2019

(30) Foreign Application Priority Data
Jul. 14, 2016 (JP) .................................. 2016-139247

(51) Int. Cl.
*H01L 29/786* (2006.01)
*H01L 29/16* (2006.01)
(Continued)

(52) U.S. Cl.
CPC ........ *H01L 29/1608* (2013.01); *H01L 29/165* (2013.01); *H01L 29/66068* (2013.01);
(Continued)

(58) Field of Classification Search
None
See application file for complete search history.

(56) References Cited

U.S. PATENT DOCUMENTS 7,217,950 B2 * 5/2007 Kaneko ................. H01L 29/165
257/20
7,338,869 B2 * 3/2008 Fukuda ................. H01L 21/049
438/285

(Continued)

FOREIGN PATENT DOCUMENTS

JP 2000-150866 A 5/2000
JP 2001-352060 A 12/2001
(Continued)

OTHER PUBLICATIONS

International Search Report dated Aug. 1, 2017, in PCT/JP2017/023023, filed Jun. 22, 2017.

*Primary Examiner* — Minh Loan Tran
(74) *Attorney, Agent, or Firm* — Oblon, McClelland, Maier & Neustadt, L.L.P.

(57) ABSTRACT

Provided is a semiconductor device includes a first semiconductor layer provided on a first main surface of the semiconductor substrate, a plurality of first semiconductor regions selectively provided at upper layer parts of the semiconductor layer, a second semiconductor region selectively provided at an upper layer part of each of the first semiconductor regions, a second semiconductor layer provided on a JFET region corresponding to the first semiconductor layer between the first semiconductor regions, and configured to cover at least a part of the JFET region, a gate insulating film covering the first semiconductor regions and the second semiconductor layer, a third semiconductor layer provided on the second semiconductor layer, a gate electrode provided on the gate insulating film, an interlayer insulating film covering the gate electrode and the gate
(Continued)

insulating film, a contact hole penetrating through the gate insulating film and the interlayer insulating film, at least the second semiconductor region being exposed to a bottom part thereof, a first main electrode provided on the interlayer insulating film, and configured to electrically connect to the second semiconductor region via the contact hole, and a second main electrode provided on a second main surface of the semiconductor substrate.

13 Claims, 9 Drawing Sheets

(51) Int. Cl.
*H01L 29/66* (2006.01)
*H01L 29/165* (2006.01)

(52) U.S. Cl.
CPC .. *H01L 29/66893* (2013.01); *H01L 29/78609* (2013.01); *H01L 29/78612* (2013.01); *H01L 29/78618* (2013.01)

(56) References Cited

U.S. PATENT DOCUMENTS

| | | | | |
|---|---|---|---|---|
| 8,354,715 | B2* | 1/2013 | Kono | H01L 29/0619 257/341 |
| 8,629,509 | B2* | 1/2014 | Ryu | H01L 21/8213 257/197 |
| 8,829,536 | B2* | 9/2014 | Shimizu | H01L 29/1608 257/77 |
| 2004/0036113 | A1 | 2/2004 | Ueno | |
| 2004/0079989 | A1 | 4/2004 | Kaneko et al. | |
| 2010/0301335 | A1 | 12/2010 | Ryu et al. | |
| 2011/0057202 | A1 | 3/2011 | Kono et al. | |
| 2013/0240906 | A1 | 9/2013 | Shimizu et al. | |

FOREIGN PATENT DOCUMENTS

| | | |
|---|---|---|
| JP | 2002-270834 A | 9/2002 |
| JP | 2004-134644 A | 4/2004 |
| JP | 2004-327891 A | 11/2004 |
| JP | 2011-60930 A | 3/2011 |
| JP | 2012-529177 A | 11/2012 |
| JP | 2013-197167 A | 9/2013 |
| WO | WO 2010/141237 A2 | 12/2010 |

* cited by examiner

F I G. 1
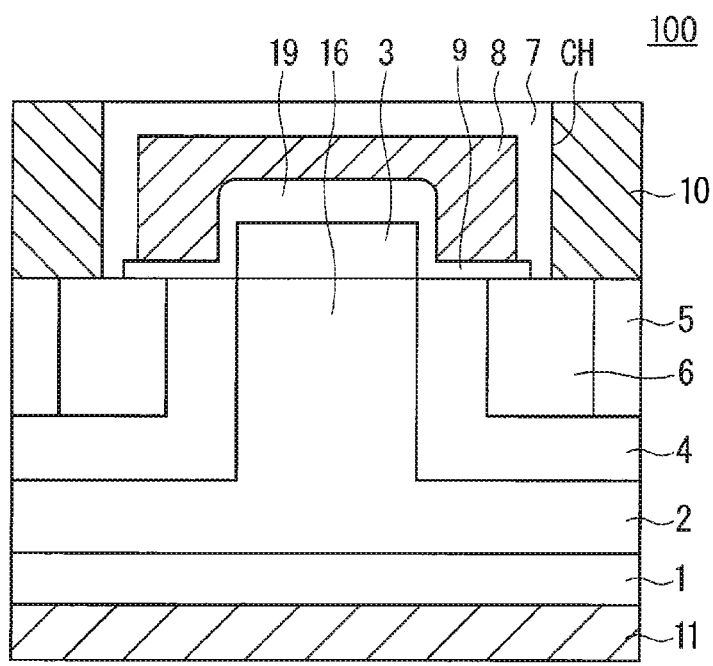
F I G. 2
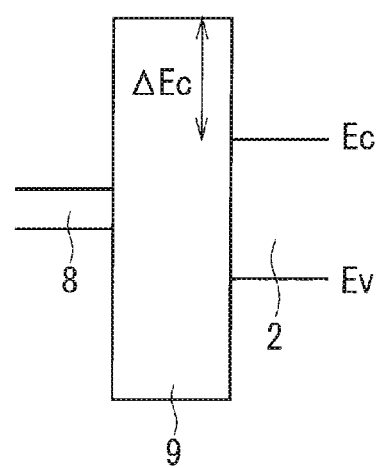

F I G. 6
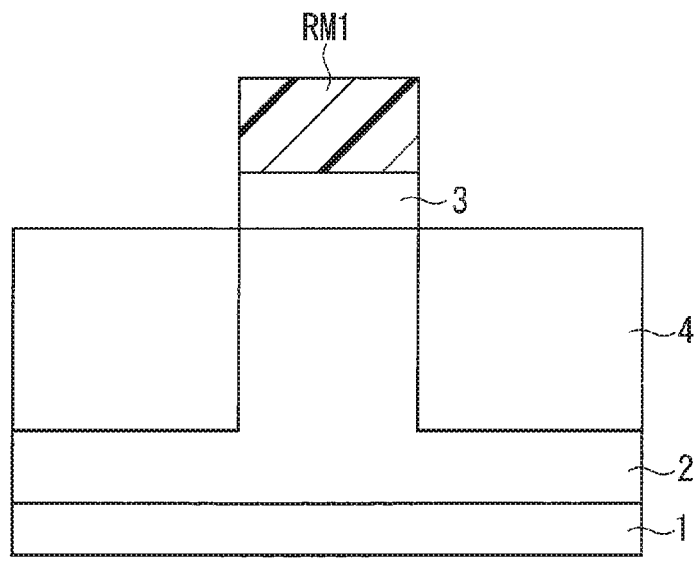
F I G. 7
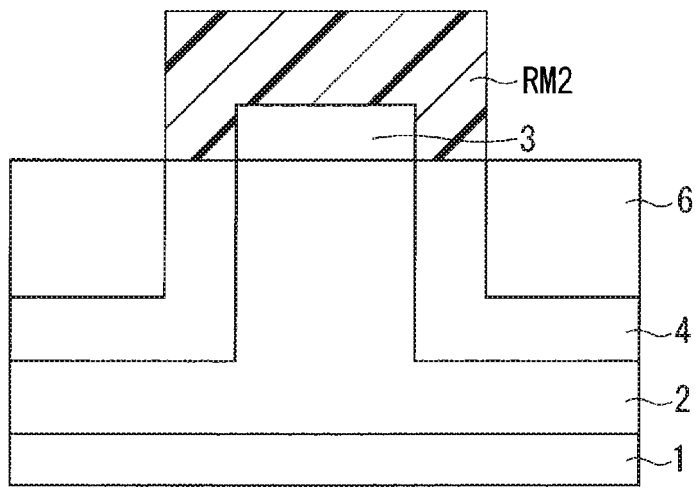

F I G. 1 2
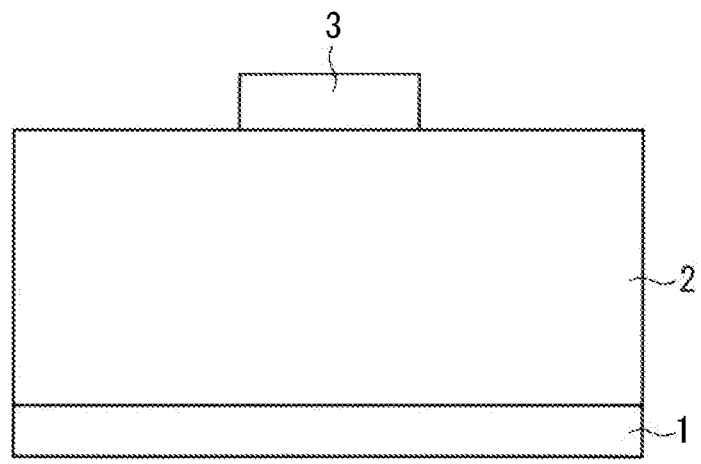
F I G. 1 3
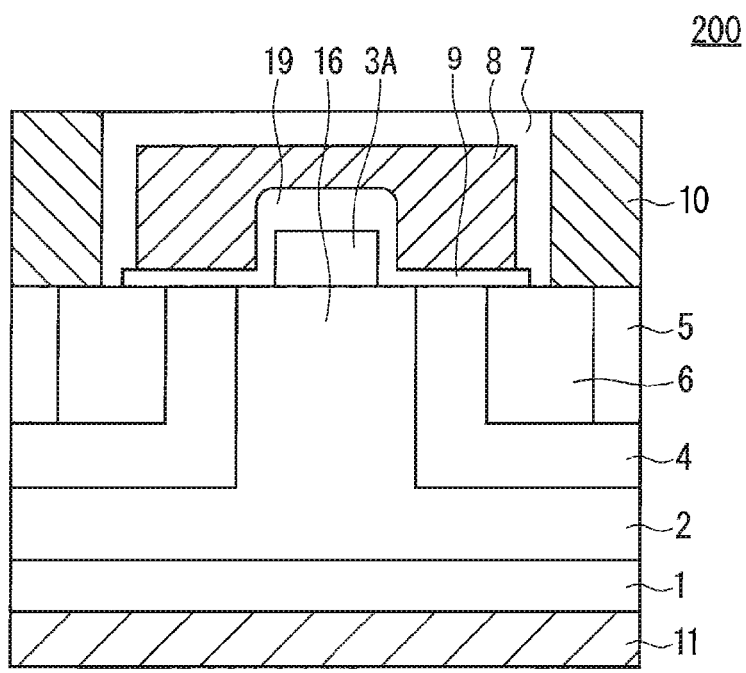

SEMICONDUCTOR DEVICE AND METHOD OF MANUFACTURING SAME

TECHNICAL FIELD

The present invention relates to a semiconductor device, and more particularly, to a semiconductor device in which the temporal change thereof is suppressed.

BACKGROUND ART

A silicon carbide (SiC) semiconductor has a wide band gap that is wider than that of a silicon (Si) semiconductor, and in comparison with a Si semiconductor device using a Si semiconductor, a SiC semiconductor device using a SiC semiconductor is excellent in breakdown voltage property, having a high allowable current density, and is high in heat resistance, therefore, an operation under a high temperature can be performed.

For example, in Metal Oxide Semiconductor Field Effect Transistor (MOSFET) using SiC, the gate insulating film that is an upper Junction Field Effect Transistor (JFET) region and, to which a high electric field is easily applied structurally, an electric field strength to be applied to the gate insulating film is maintained low, thereby suppressing destruction of the gate insulating film when a high voltage is applied.

For example, in a semiconductor device disclosed in Patent Document 1, a P$^-$ region in which a p-type impurity concentration is relatively low is provided in a JFET region of the SiC-MOSFET, thereby, in comparison with the structure without the P$^-$ region, suppressing the electric field strength applied to the gate insulating film that is the upper JFET region, therefore, credibility thereof when the high voltage is applied to the device is improved.

Also, a technique is developed, in which, in a semiconductor device, semiconductors each having a different band gap from one another are brought into ohmic contact in part with each other, thereby reducing an on-resistance. In patent Document 2, a technique in which the impurity concentration is set to high at a portion to be ohmically connected in heterojunction of semiconductors, thereby reducing the on-resistance of the whole device.

PRIOR ART DOCUMENTS

Patent Documents

[Patent Document 1] Japanese Patent Application Laid-Open No. 2011-060930
[Patent Document 2] Japanese Patent Application Laid-Open No. 2004-327891

SUMMARY

Problem to be Solved by the Invention

According to Patent Document 1, in an insulated gate semiconductor device using silicon carbide, the credibility of the gate oxide film is damaged when the high electric field is applied to the oxide film above the JFET region. Accordingly, in the insulated gate semiconductor device using silicon carbide, there has been a problem in that, the gate oxide film is degraded with time when the high electric field is applied to the oxide film above the JFET region.

The present invention has been made to solve the above-mentioned problem and has an object of the present invention to provide an insulate gate semiconductor device that suppresses changes of the gate insulating film above the JFET region with time.

Means to Solve the Problem

According to the present invention, a semiconductor device includes a semiconductor substrate, a first semiconductor layer of a first conductivity type, provided on a first main surface of the semiconductor substrate, a plurality of first semiconductor regions selectively provided at upper layer parts of the first semiconductor layer, the plurality of first semiconductor regions having a second conductivity type, a second semiconductor region selectively provided at an upper layer part of each of the first semiconductor regions, the second semiconductor region having a first conductivity type, a second semiconductor layer provided on a JFET region corresponding to the first semiconductor layer between the first semiconductor regions, and configured to cover at least a part of the JFET region, a third semiconductor layer provided on the second semiconductor layer, a gate insulating film provided such that the first semiconductor regions and the third semiconductor layer are covered therewith, a gate electrode provided on the gate insulating film, an interlayer insulating film provided such that the gate insulating film and the gate electrode are covered therewith, a contact hole penetrating through the gate insulating film and the interlayer insulating film, at least the second semiconductor region being exposed to a bottom part thereof, a first main electrode provided on the interlayer insulating film, and configured to electrically connect to the second semiconductor region via the contact hole, and a second main electrode provided on a second main surface of the semiconductor substrate. The first semiconductor layer is configured of a silicon carbide semiconductor having a first band gap. The second semiconductor layer is configured of a semiconductor having a second band gap being narrower than the first band gap. The third semiconductor layer is configured of a semiconductor having a third band gap being narrower than the second band gap.

Effects of the Invention

Between the JFET region and the gate insulating film, a second semiconductor layer having a second band gap being narrower than a first band gap is provided, therefore, in comparison with the semiconductor device of the related art, the band offset of the gate insulating film and a semiconductor interface in the JFET region and becomes large, thereby ensuring the control of a current value flowing into the gate insulating film above the JFET region. Thus, the changes of the gate insulating film above the JFET region with time are suppressed.

These and other objects, features, aspects and advantages of the present invention will become more apparent from the following detailed description of the present invention when taken in conjunction with the accompanying drawings.

BRIEF DESCRIPTION OF DRAWINGS

FIG. 1 A cross-sectional view illustrating a configuration of a semiconductor device of Embodiment 1 according to the present invention.
FIG. 2 A band diagram of a semiconductor device of the related art.

FIG. 6 A cross-sectional view illustrating the manufacturing process of the semiconductor device of Embodiment 1 according to the present invention.

FIG. 7 A cross-sectional view illustrating the manufacturing process of the semiconductor device of Embodiment 1 according to the present invention.

FIG. 12 A cross-sectional view illustrating Modification of the manufacturing process of the semiconductor device of Embodiment 1 according to the present invention.

FIG. 13 A cross-sectional view illustrating a configuration of a semiconductor device of Embodiment 2 according to the present invention.

DESCRIPTION OF EMBODIMENT(S)

<Introduction>

Figure 3:
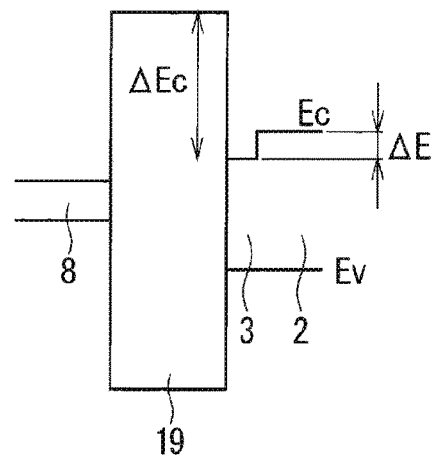
FIG. 3 A band diagram of the semiconductor device of Embodiment 1 according to the present invention.

Inventors have considered that degradation of a gate insulating film with time is caused by an electron injection or a hole injection into an oxide film. Specifically, the mechanism caused by the electron injection or the hole injection when a high electric field is applied to a gate electrode is considered to be the Fowler-Nordheim (FN) tunneling phenomenon. On the basis of the FN tunneling phenomenon, the injection amount of electron or hole into the oxide film is defined by a band offset of the oxide film and silicon carbide, the effective mass of electron or hole in silicon carbide, and the electric field strength applied to the oxide film.

And, the assuming that the electric field strength applied to the oxide film is constant, in order to suppress the degradation of the gate oxide film above a JFET field, suppression of injection of electron or hole into the oxide film is required. However, when a single semiconductor having band gap uniformity, the band offset of the oxide film and silicon carbide and the effective mass of electron or hole in silicon carbide are unchanged, therefore, the inventors have reached to a conclusion that the suppression of injection of electron or hole into the oxide film is not ensured. And, they achieved a technical concept that injection of electron or hole into the oxide film is suppressed by using a plurality of semiconductors each having a different band gap from one another.

<Embodiment 1>
<Configuration of Device>

FIG. 1 is a cross-sectional view illustrating a configuration of a semiconductor device of Embodiment 1 according to the present invention. More specifically, a cross-sectional view schematically illustrating a partial configuration of a field effect transistor having a MOS structure formed on a SiC substrate (SiC-MOSFET) 100. It should be noted that, in FIG. 1, a minimum unit structure of MOS called "unit cell" is illustrated, and an actual semiconductor device includes a plurality of unit cells.

Here, the term "MOS" has indicated a junction structure of metal, oxide, and semiconductor for a long time, and is the abbreviation of Metal-Oxide-Semiconductor. However, in a field effect transistor having a MOS structure (hereinafter referred to simply as "MOS transistor"), in particular, materials of gate insulating films and gate electrodes are improved in view of integration thereof of recent years, improvements in the production process, and so forth, For example, in a MOSFET, in view of mainly forming a source-drain in a self-aligning manner, polycrystalline silicon is employed as a material of the gate electrode, instead of metal. Also, in view of improving electric characteristics, a material of a high dielectric constant is employed as a material of the gate insulating film, however, the material is not necessarily limited to oxide.

Accordingly, the term "MOS" is employed but not necessarily limited only to the lamination structure of metal-oxide-semiconductor, and therefore, such limitation is not assumed in the present specification. That is, in view of the common general technical knowledge, the term "MOS" here includes not only the meaning of the abbreviation stemming from the origin of the term, but also broadly includes the meaning of the lamination structure of conductor-insulator-semiconductor.

Further, in the following description, with respect to a conductivity type for impurities, the n-type is defined as a first conductivity type, and the p-type is defined as a second conductivity type, the definitions may be inverted.

As illustrated in FIG. 1, the SiC-MOSFET 100 is formed on a SiC substrate that contains n-type (first conductivity type) impurities relatively in high concentration in the range of $1 \times 10^{18}$ and $1 \times 10^{21}$ cm$^{-3}$.

On the main surface of the SiC substrate 1, a semiconductor layer 2 (a first semiconductor layer) that contains the n-type impurities relatively in low concentration in the range of $1 \times 10^{14}$ and $1 \times 10^{17}$ cm$^{-3}$ is formed. The semiconductor layer 2 is formed by epitaxial growth, for example, and is also referred to as a drift layer or a drain region.

At upper layer parts of the semiconductor layer 2, a plurality of well regions 4 (first semiconductor regions) that contain p-type (second conductivity type) impurities relatively in high concentration in the range of $1 \times 10^{15}$ and $1\times10^{19}$ cm$^{-3}$ are selectively formed, and at each of upper layer parts of the respective well regions 4, a well contact region 5 that contains p-type impurities relatively in high concentration in the range of $1\times10^{18}$ and $1\times10^{21}$ cm$^{-3}$ is selectively formed. And, source regions 6 (second semiconductor region) each contain n-type impurities relatively high in concentration in the range of $1\times10^{18}$ and $1\times10^{21}$ cm$^{-3}$ are formed such that a side surface of each of the well contact regions 5 is brought into contact therewith.

It should be noted that the depth of the well region 4 with respect to the uppermost surface of the semiconductor layer 2 is deeply formed deeper than the depth of the source region 6 and well contact region 5 with respect to the uppermost surface of the semiconductor layer 2.

And, a portion of the semiconductor layer 2 corresponding to a portion between the adjacent well regions 4 to each other is a JFET region 16, and the JFET region 16 is also included in the unit cell. It should be noted that the JFET region 16 includes not only the portion of the semiconductor layer 2 between the well regions 4 but may also include a portion of the semiconductor layer 2 below thereof.

And, on one side of the main surface of the semiconductor layer 2 corresponding to the upper JFET region 16, a semiconductor layer 3 (a second semiconductor layer) is formed such that the entire JFET region 16 is covered therewith.

The semiconductor layer 3 entirely covers the JFET region 16, therefore, in the JFET region 16, a portion in which the electric field strength becomes large, is securely protected.

The upper surface and the side surfaces of the semiconductor layer 3 are covered by an insulating film 19. Also, a gate insulating film 9 is provided on the one surface of the main surface of the semiconductor layer 2 of which outside the both of side surfaces of the semiconductor layer 3 such that a region above the well region 4 over a part of the upper portion of the source region 6 is covered therewith. Here, the insulating film 19 that covers the upper surface and the side surfaces of the semiconductor layer 3 does not function as a gate insulating film, however, the insulating film 19 is formed in the same step with the gate insulating film 9, therefore, may also be referred to as a gate insulating film. It should be noted that, in the above, the description is made that the SiC-MOSFET 100 is an n-channel type, however, the SiC-MOSFET 100 may be a p-channel type. In that case, the conductivity types of the above described respective semiconductor layers and respective semiconductor regions are inverted. Also, the conductivity type of the semiconductor layer 3 may be either p-type or n-type, regardless of the conductivity type of the SiC-MOSFET 100.

And, a gate electrode 8 is formed such that the insulating film 19 and the gate insulating film 9 are covered therewith. Also, an interlayer insulating film 7 is formed such that the gate electrode 8 is covered therewith, contact holes CH are provided such that the contact holes CH each penetrate through the interlayer insulating film 7 and extends to on the well contact regions 5 and the part of the respective upper portions of the source regions 6, and source electrodes 10 (first main electrode) are embedded in the contact holes CH.

Also, on the rear surface of the SiC substrate 1 (the main surface opposite to the side on which the semiconductor layer 2 is provided), a drain electrode 11 (a second main electrode) is formed, a channel is formed in the well region 4 immediately below the gate insulating film 9 by applying a high voltage between the source electrode 10 and the drain electrode 11, and further by applying a positive voltage to the gate electrode 8, and a current flows through a path from the source region 6 through the channel region, JFET region 16, the semiconductor layer 2, the SiC substrate 1, and the drain electrode 11.

Here, the semiconductor layer 2 is composed of SiC of 4H polytype having a high breakdown electric field, thereby improving a breakdown voltage thereof.

Also, polytype silicon carbide that is different from polytype silicon carbide of the semiconductor layer 2 is used for the semiconductor layer 3, thereby ensuring the production in an integrated film forming process.

That is, when the semiconductor layer 2 is composed of 4H—SiC, and the semiconductor layer 3 is composed of 3C—SiC or 6H—SiC, along with the improvement of the breakdown voltage by the 4H—SiC having a high breakdown electric field, the band offset of the gate insulating film 19 and the semiconductor layer 3 becomes larger than the band offset of the gate insulating film 19 and the semiconductor layer 2.

FIG. 2 illustrates a band diagram of an insulated gate semiconductor device of the related art without the semiconductor layer 3, and the gate insulating film 9 is directly brought into contact with the semiconductor layer 2. In FIG. 2, Ec represents a conduction band edge of the semiconductor layer 2, Ev represents a valence band edge, and ΔEc represents an energy difference (band offset) between the conduction band edge Ec of the semiconductor layer 2 and an energy band edge of the gate insulating film 9. Meanwhile, FIG. 3 illustrates a band diagram of an insulated gate semiconductor device including the semiconductor layer 3, and the semiconductor layer 3 is interposed between the gate insulating film 19 and the semiconductor layer 2. Also, ΔE represents a band offset of the conduction band edge Ec of the semiconductor layer 2 and a conduction band edge Ec of the semiconductor layer 3.

As illustrated in FIG. 3, the conduction band edge Ec of the semiconductor layer 3 is lower than the conduction band edge Ec of the semiconductor layer 2, the band offset ΔEc of the conduction band edge Ec of the semiconductor layer 3 and the energy band edge of the gate insulating film 19 becomes larger than that of in FIG. 2.

Accordingly, by covering the JFET region 16 with the semiconductor layer 3 composed of polytype silicon carbide that is different from polytype silicon carbide of the semiconductor layer 2, the band offset of the gate insulating film 19 and a semiconductor interface is increased, also, by controlling the effective mass of electrons or holes with the semiconductor layer 3, suppression of electrons or holes injected into the gate insulating film 19 above the JFET region 16 is ensured, and control of a current value flowing into the gate insulating film 19 above the JFET region 16 is ensured.

That is, the amount of electrons or holes injected into the gate insulating film 19 is determined by the band offset and the effective mass, as the band offset becomes larger, or the effective mass becomes larger, the electrons or holes injected into the gate insulating film 19 from the semiconductor layer 2 decrease.

And, the band offset of the gate insulating film 19 and the semiconductor interface is determined by a physical property value, if the same gate insulating film 19, by using the semiconductor layer 3 having the lower conduction band edge or the valence band edge than those of the semiconductor layer 2, the band offset of the gate insulating film 19 and a semiconductor interface is increased. Further, the effective mass is a physical property value uniquely used in semiconductor materials, therefore, by providing the semiconductor layer 3 different from the semiconductor layer 2, selection of the band offset and the effective mass is ensured, and the suppression of electrons or holes injected into the insulating film 19 above the JFET region 16 is ensured. As a result, suppression of changes of the gate insulating film 19 above the JFET region 16 with time is ensured.

It should be noted that, to obtain such an effect, the band offset ΔE of the conduction band edge Ec of the semiconductor layer 2 and the conduction band edge Ec of the semiconductor layer 3 is preferred to be 0.3 eV or more. Specifically, it is preferred that the semiconductor layer 3 and the semiconductor layer 2 are selected such that the conduction band of the semiconductor layer 3 to be lower than the conduction band of the semiconductor 2 by 0.3 eV or more. As the band offset becomes larger, an inflow of carriers into the gate insulating film 19 is more suppressed.

It should be noted that when the semiconductor layer 2 is composed of SiC of 4H polytype and the semiconductor layer 3 is composed of 3C—SiC, the band offset ΔE of the conduction band edge Ec of the semiconductor layer 2 and the conduction band edge Ec of the semiconductor layer 3 is 0.9 eV or so, and when the semiconductor layer 3 is composed of 6H—SiC, the band offset ΔE of the conduction band edge Ec of the semiconductor layer 2 and the conduction band edge Ec of the semiconductor layer 3 is 0.15 eV or so.

<Manufacturing Method>

Next, a method of manufacturing the SiC-MOSFET 100 is described by referring to FIGS. 4 to 10 which are the cross-sectional views sequentially illustrating the manufacturing process.

Figure 4:
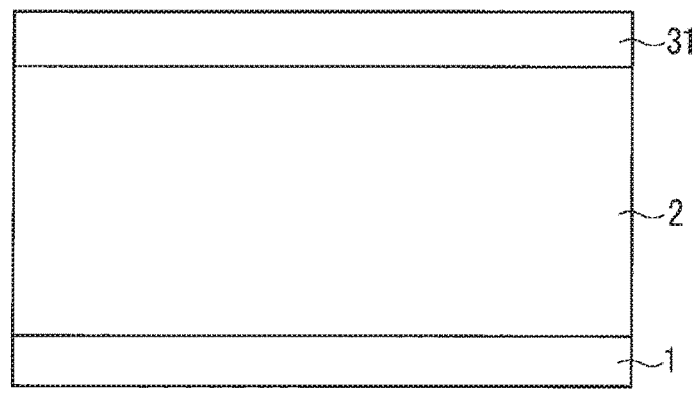
FIG. 4 A cross-sectional view illustrating a manufacturing process of the semiconductor device of Embodiment 1 according to the present invention.

First, as illustrated in FIG. 4, on one side of a main surface (front side main surface) of a SiC substrate 1, an n-type semiconductor layer 2 is epitaxially grown by chemical vapor deposition (CVD), here, the semiconductor layer 2 is a silicon carbide semiconductor layer composed of 4H polytype same as that of the SiC substrate 1.

It should be noted that the SiC substrate 1 has a thickness of 10 to 500 μm and contains n-type impurities in the range of $1\times10^{18}$ and $1\times10^{21}$ cm$^{-3}$. It should be noted that the semiconductor layer 2 has a thickness of 3 to 250 μm and contains n-type impurities in the range of $1\times10^{14}$ and $1\times10^{17}$ cm$^{-3}$. It should be noted that the thickness of the semiconductor layer 2 is determined depending on a breakdown voltage (working voltage) the SiC-MOSFET 100 requires. Thereafter, on the semiconductor layer 2, an epitaxial layer 31 composed of polytype silicon carbide that is different from polytype silicon carbide of the semiconductor layer 2 is grown by CVD. The epitaxial layer 31 has a thickness of 3 nm to 3 μm and contains n-type impurities or p-type impurities in the range of $1\times10^{14}$ and $1\times10^{19}$ cm$^{-3}$.

Forming the semiconductor layer 3 by epitaxial growth facilitates concentration control of impurities of the semiconductor layer 3.

It should be noted that, by setting the thickness of the semiconductor layer 3 to be 200 nm or less, the electric field applied to the gate insulating film 19 is relaxed without increasing resistance of the JFET region 16.

Specifically, along with the increase of the film thickness of the semiconductor layer 3, the difficulty in forming an inversion layer at an upper layer part of the JFET region 16 increases, the thickness of the gate insulating film 19 above the JFET region 16 practically becomes thicker, therefore the resistance of the JFET region is increased, and an on-resistance is increased. Therefore, the semiconductor layer 3 has, preferably, a film thickness as thin as possible.

Here, when the polytype of the semiconductor layer 2 is 4H, the polytype of the epitaxial layer 31 is considered to be 3C or 6H, however, it is not limited thereto, also, the epitaxial layer 31 is not limited to silicon carbide. A semiconductor having a lower valence band edge than that of the semiconductor layer 2 (or, a semiconductor having a high conduction band edge) which can be formed on the semiconductor layer 2 may be applicable.

Figure 5:
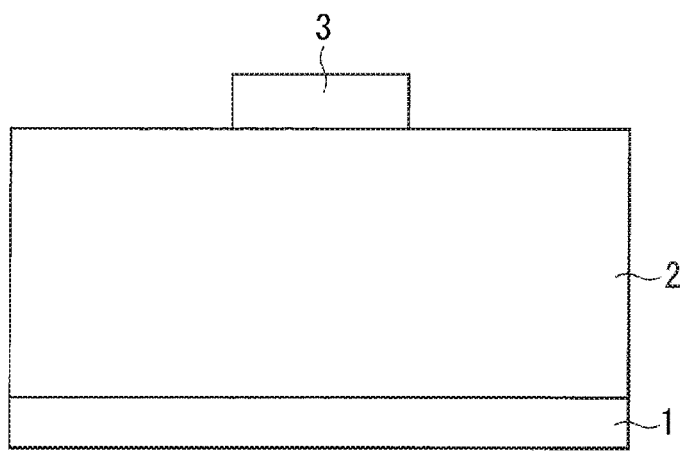
FIG. 5 A cross-sectional view illustrating the manufacturing process of the semiconductor device of Embodiment 1 according to the present invention.

Next, in the step of FIG. 5, on the epitaxial layer 31, a mask (not shown) having a pattern that covers only a region that is to be the semiconductor layer 3 is formed by a technique of photolithography, by using the mask, the epitaxial layer 31 is selectively removed by etching, thereby patterning the semiconductor layer 3 on the semiconductor layer 2. As the mask, a resist mask is used, for example.

Next, in the step of FIG. 6, a mask RM1 that covers over the semiconductor layer 3 and that has openings so that regions that are to be the well regions 4 become exposed is formed by the technique of photolithography. It should be noted that, as the mask RM1, the mask used for patterning of the semiconductor layer 3 may be reused. After the mask RM1 is formed, p-type impurities are ion implanted from above the mask RM1, thereby selectively forming the well regions 4 at upper layer parts of the semiconductor layer 2. Here, the well regions 4 each have a thickness of 0.1 to 3 μm and the impurity concentration thereof is set in the range of $1\times10^{15}$ and $1\times10^{19}$ cm$^{-3}$. As the mask, a resist mask is used, for example.

Next, in the step of FIG. 7, a mask RM2 that covers over the semiconductor layer 3 and that has openings so that regions that are to be the source regions 6 and the well contact regions 5 become exposed is formed by the technique of photolithography. After the mask RM2 is formed, p-type impurities are ion implanted from above the mask RM2, thereby selectively forming the source regions 6 at upper layer parts of the well regions 4. Here, the source regions 6 each have a thickness of 0.03 to 2.5 μ m and the impurity concentration thereof is set in the range of $1\times10^{18}$ and $1\times10^{21}$ cm$^{-3}$. As the mask, a resist mask is used, for example.

Figure 8:
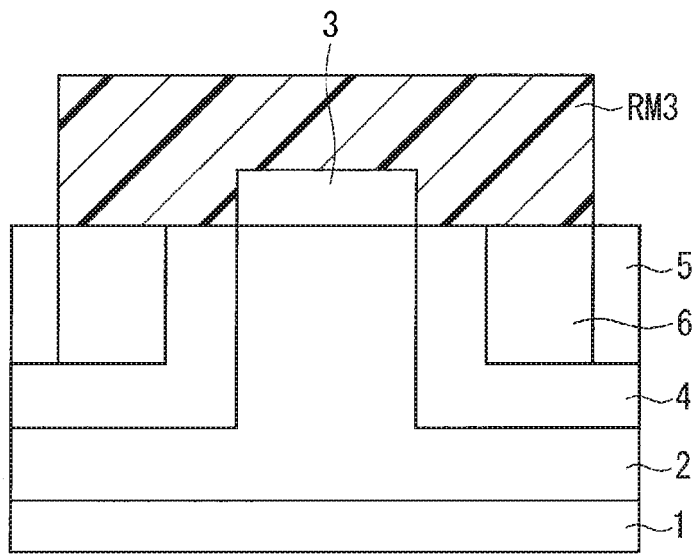
FIG. 8 A cross-sectional view illustrating the manufacturing process of the semiconductor device of Embodiment 1 according to the present invention.

Next, in the step of FIG. 8, a mask RM3 that covers over the semiconductor layer 3 and that has openings so that regions that are to be the well contact regions 5 become exposed is formed by the technique of photolithography. After the mask RM3 is formed, p-type impurities are ion implanted from above the mask RM3, thereby selectively forming the well contact regions 5 at upper layer parts of the well regions 4. Here, the well contact regions 5 each have a thickness of 0.03 to 2.5 μm and the impurity concentration thereof is set in the range of $1\times10^{18}$ and $1\times10^{21}$ cm$^{-3}$. As the mask, a resist mask is used, for example. After removing the mask RM3, annealing is performed to activate the impurities. As a condition of annealing is to perform heating in a nitrogen or argon atmosphere at 1500° C. or above for 30 minutes or longer, however this is a mere example It should be noted that the order of performing ion plantation and activation for the well regions 4, the well contact regions 5, and the source regions 6 may be arbitrary.

Figure 9:
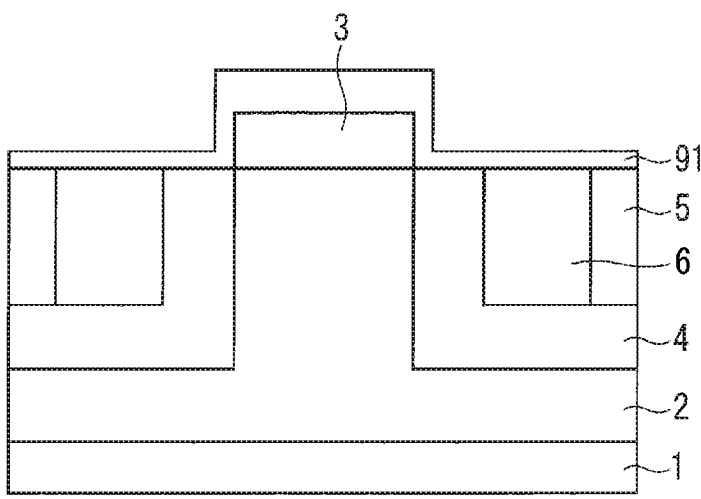
FIG. 9 A cross-sectional view illustrating the manufacturing process of the semiconductor device of Embodiment 1 according to the present invention.

Next, in the step of FIG. 9, on the whole surface of the one side of the main surface of the SiC substrate 1 is formed. Forming of the silicon oxide film 91 may be performed by CVD or a thermal oxidation method. It should be noted that the silicon oxide film 91 is formed such that the film thickness of the upper surface and the side surfaces on the semiconductor layer 3 is formed so that the film thickness of the insulating film 19 (FIG. 1) is thicker than the gate insulating film 9 (FIG. 1), thereafter selectively removing thereof for the gate insulating film 9 to have the predetermined thickness. Naturally, the whole silicon oxide film 91 may be formed to have the same thickness as the gate insulating film 9. It should be noted that the gate insulating film 9 has a thickness of 50 nm or so, for example. Also, the gate insulating film 9 is not limited to silicon oxide film ($SiO_2$), SiON, SiN, $Al_2O_3$, $HfO_2$, $La_2O_3$, and so forth are applicable thereto.

Figure 10:
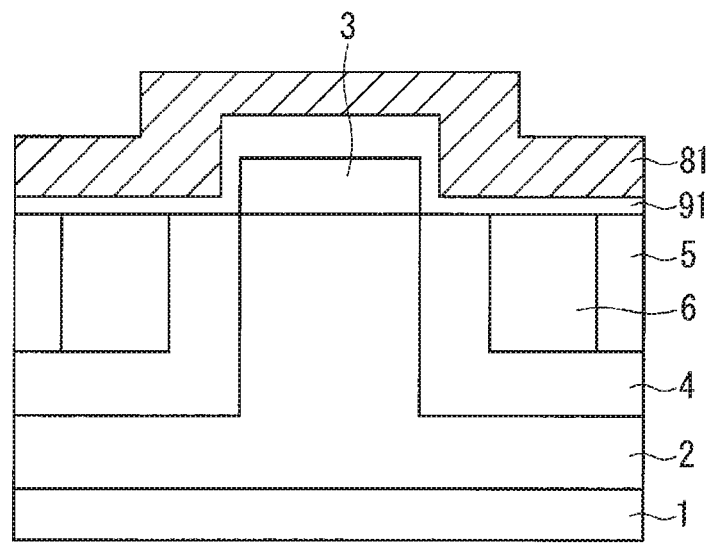
FIG. 10 A cross-sectional view illustrating the manufacturing process of the semiconductor device of Embodiment 1 according to the present invention.

Next, in the step of FIG. 10, a polycrystalline silicon film 81 containing n-type impurities or p-type impurities in the range of $1 \times 10^{17}$ and $1 \times 10^{21}$ $cm^{-3}$ is formed by, for example, CVD such that the silicon oxide film 91 is covered therewith.

Thereafter, the gate electrode 8 is patterned by selectively removing the polycrystalline silicon film 81 such that the polycrystalline silicon film 81 remains above the semiconductor layer 3, outside of the side surfaces of the semiconductor layer 3, above the well regions 4, and on at least a part of each of the source regions 6.

Thereafter, the silicon oxide film is formed to be the interlayer insulating film 7, on the whole surface of the one side of the main surface of the SiC substrate 1 including the gate electrode 8, and the contact holes CH penetrating through the interlayer insulating film 7 and extending to on the well contact regions 5 and the part of the upper portion of each of the source regions 6 are formed.

And, a source electrode 10 is formed such that the contact hole CH is embedded therein, a drain electrode 11 is formed on a rear surface of the SiC substrate 1, thereby obtaining the SiC-MOSFET 100 illustrated in FIG. 1. It should be noted that the source electrode 10 and the drain electrode 11 may be formed of a metal film made of nickel, gold, copper, and so forth.

It should be noted that, in the description above, although an example in which the semiconductor layer 3 is formed on the semiconductor layer 2, and then the impurity regions such as the well regions 4 and so forth are formed is described, however, the semiconductor layer 3 may be formed after the impurity regions such as the well regions 4 and so forth are formed in the semiconductor layer 2. In this case, after the impurity regions are formed, the first activation annealing is performed before the semiconductor layer 3 is formed, and the second activation annealing is performed after the semiconductor layer 3 is formed. In any cases, activation annealing is preferred to perform before the gate insulating film 9 is formed. Also, the number of activation annealing operations may be twice or more <Modification>

The semiconductor layer 3 may be formed by ion implanting a group of IV element in an upper layer part of the semiconductor layer 2, without using epitaxial growth. In the case using ion implant, control of the depth of the semiconductor layer 3 is facilitated.

Implanting the group of IV element in the semiconductor layer 2 widens a lattice spacing in an implant region of the semiconductor layer 2, a semiconductor having a smaller band gap than that of the semiconductor layer 2 is formed, and the band offset of the gate insulating film 19 and the semiconductor layer 3 becomes large. An applicable group of IV element includes germanium, silicon, tin, and carbon. For example, by controlling an addition amount of germanium, the band gap becomes small, with respect to the band gap of 4H—SiC, by 0.05 eV to 0.5 eV.

Also, before or after ion implant of the group of IV element, n-type impurities or p-type impurities may be introduced into the semiconductor layer 3 by ion implant or thermal diffusion.

Hereinafter, referring to FIGS. 11 and 12, a method of forming the semiconductor layer 3 by ion implant is described.

Figure 11:
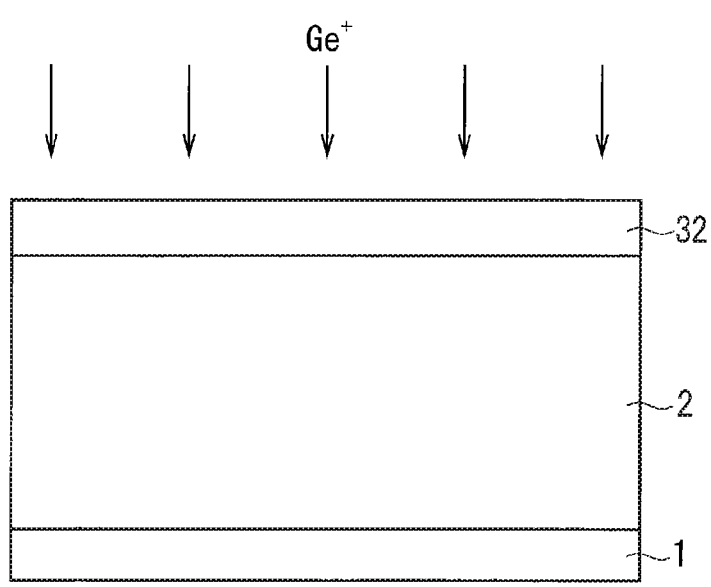
FIG. 11 A cross-sectional view illustrating Modification of the manufacturing process of the semiconductor device of Embodiment 1 according to the present invention.

As illustrated in FIG. 11, on the one side of the main surface of the SiC substrate 1, an n-type semiconductor layer 2 is epitaxially grown by CVD for example, thereafter, germanium (Ge), for example, is ion implanted into an upper layer part of the semiconductor layer 2, with an implant energy of 100 keV or so to form an ion implant layer 32.

Next, in the step of FIG. 12, on the ion implant layer 32, a mask (not shown) having a pattern that covers only a region that is to be the semiconductor layer 3 is formed by a technique of photolithography, by using the mask, the ion implant layer 32 is selectively removed by etching, thereby patterning the semiconductor layer 3 on the semiconductor layer 2. The following steps are the same as the steps described referring to FIGS. 6 to 10. As the mask, a resist mask is used, for example.

<Embodiment 2>
<Configuration of Device>

FIG. 13 is a cross-sectional view illustrating a configuration of a semiconductor device of Embodiment 2 according to the present invention. It should be noted that, in FIG. 13, the components that are the same as the SiC-MOSFET 100 described referring to FIG. 1 are denoted by the same reference symbols and overlapping descriptions are omitted.

As illustrated in FIG. 13, in a SiC-MOSFET 200, on one side of a main surface of the semiconductor layer 2 corresponding to the upper JFET region 16, a semiconductor layer 3A (a second semiconductor layer) is formed such that the JFET region 16 is partially covered therewith.

The semiconductor layer 3A partially covers the JFET region 16, therefore, in the JFET region 16, a portion in which the electric field strength becomes large, is securely protected. Also, when the width of the semiconductor layer 3A is smaller than the width of the JFET region 16, the gate insulating film 9 is provided above the JFET region 16, thereby lowering the connection resistance between the well region 4 and the semiconductor layer 2.

Here, the semiconductor layer 2 is composed of SiC of 4H polytype having a high breakdown electric field, thereby improving a breakdown voltage thereof. Also, polytype silicon carbide that is different from polytype silicon carbide of the semiconductor layer 2 is used for the semiconductor layer 3A, thereby ensuring the production in an integrated film forming process.

That is, when the semiconductor layer 2 is composed of 4H—SiC, and the semiconductor layer 3A is composed of 3C—SiC or 6H—SiC, along with the improvement of the breakdown voltage by the 4H—SiC having a high breakdown electric field, the band offset of the gate insulating film 19 and the semiconductor layer 3A becomes larger than the band offset of the gate insulating film 19 and the semiconductor layer 2.

Accordingly, by covering the JFET region 16 with the semiconductor layer 3A composed of silicon carbide of polytype different from that of the semiconductor layer 2, the band offset of the gate insulating film 19 and a semiconductor interface is increased, also, by controlling the effective mass of electrons or holes with the semiconductor layer 3A, suppression of electrons or holes injected into the gate insulating film 19 above the JFET region 16 is ensured, and control of a current value flowing into the gate insulating film 19 above the JFET region 16 is ensured.

<Modification>

Also in the SiC-MOSFET 200, the semiconductor layer 3A may be formed by ion implanting the group of IV element in an upper layer part of the semiconductor layer 2, without using epitaxial growth. The forming method is described in Embodiment 1, therefore, the description is omitted.

<Embodiment 3>
<Configuration of Device>

Figure 14:
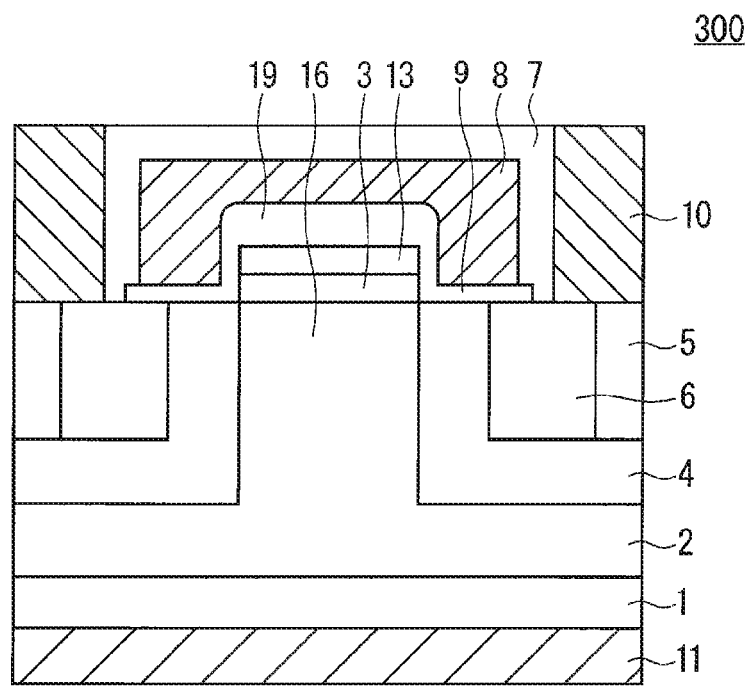
FIG. 14 A cross-sectional view illustrating a configuration of a semiconductor device of Embodiment 3 according to the present invention.

FIG. 14 is a cross-sectional view illustrating a configuration of a semiconductor device of Embodiment 3 according to the present invention. It should be noted that, in FIG. 14, the components that are the same as the SiC-MOSFET 100 described referring to FIG. 1 are denoted by the same reference symbols and overlapping descriptions are omitted.

As illustrated in FIG. 14, in a SiC-MOSFET 300, on one side of a main surface of the semiconductor layer 2 corresponding to the upper JFET region 16, a semiconductor layer 3 (a second semiconductor layer) is formed such that the JFET region 16 is covered therewith, and a semiconductor layer 13 (a third semiconductor layer) is formed such that the semiconductor layer 3 is covered therewith. It should be noted that the semiconductor layer 13 is also formed by epitaxial growth. And, the upper surface and the side surfaces of laminated films of the semiconductor layers 3 and 13 are covered by an insulating film 19.

Here, the semiconductor layer 2 is composed of SiC of 4H polytype having a high breakdown electric field, thereby improving a breakdown voltage thereof. Also, polytype silicon carbide that is different from polytype silicon carbide of the semiconductor layer 2 is used for the semiconductor layer 3, thereby ensuring the production in an integrated film forming process.

That is, when the semiconductor layer 2 is composed of 4H—SiC, and the semiconductor layer 3 is composed of 3C—SiC or 6H—SiC, along with the improvement of the breakdown voltage by the 4H—SiC having a high breakdown electric field, the band offset of the gate insulating film 19 and the semiconductor layer 3 becomes larger than the band offset of the gate insulating film 19 and the semiconductor layer 2.

Accordingly, by covering the JFET region 16 with the semiconductor layer 3 composed of polytype silicon carbide that is different from polytype silicon carbide of the semiconductor layer 2, the band offset of the gate insulating film 19 and a semiconductor interface is increased, also, by controlling the effective mass of electrons or holes with the semiconductor layer 3, suppression of electrons or holes injected into the gate insulating film 19 above the JFET region 16 is ensured, and control of a current value flowing into the gate insulating film 19 above the JFET region 16 is ensured.

Also, by employing the configuration in which the semiconductor layer 13 covers on the semiconductor layer 3, a nitride semiconductor AlN, for example, is applicable to the semiconductor layer 13 which has a difficulty in directly growing on the semiconductor layer 2. It should be noted that, although the conductivity type of the semiconductor layer 3 may be either p-type or n-type, the conductivity type of the semiconductor layer 13 is the same conductivity type applied to the semiconductor layer 3.

In the case where AlN is applied to the semiconductor layer 13, the band offset of the gate insulating film 19 and the semiconductor layer 13 becomes larger than the band offset of the gate insulating film 19 and the semiconductor layer 3, also, by providing the semiconductor layer 13, a selection range of effective mass is further expanded.

Figure 15:
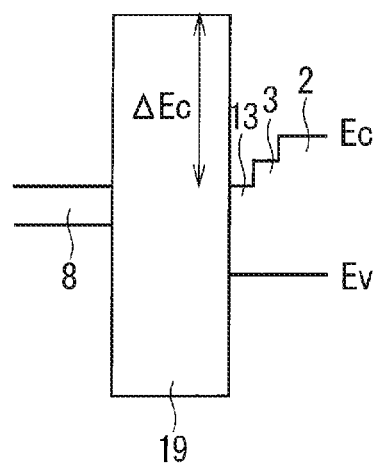
FIG. 15 A cross-sectional view illustrating the configuration of the semiconductor device of Embodiment 3 according to the present invention.

Here, FIG. 15 illustrates a band diagram of an insulated gate semiconductor device including the semiconductor layer 13, and the semiconductor layers 13 and 3 are interposed between the gate insulating film 19 and the semiconductor layer 2. As illustrated in FIG. 15, the conduction band edge Ec of the semiconductor layer 13 is lower than the conduction band edge Ec of the semiconductor layer 3, the band offset ΔEc of the conduction band edge Ec of the semiconductor layer 13 and the energy band edge of the gate insulating film 19 becomes larger than that of in FIG. 3.

Accordingly, by covering the JFET region 16 with the semiconductor layers 3 and 13 composed of polytype silicon carbide that is different from polytype silicon carbide of the semiconductor layer 2, the band offset of the gate insulating film 19 and a semiconductor interface is increased, also, by controlling the effective mass of electrons or holes with the semiconductor layers 3 and 13, suppression of electrons or holes injected into the gate insulating film 19 above the JFET region 16 is ensured, and control of a current value flowing into the gate insulating film 19 above the JFET region 16 is ensured.

<Modification>

Also in the SiC-MOSFET 300, the semiconductor layers 3 and 13 may be formed by ion implanting the group of IV elements at upper layer parts of the semiconductor layer 2, without using epitaxial growth. In this case, ion species of the group of IV element to be implanted into the semiconductor layer 3 and ion species of the group of IV element to be implanted into the semiconductor layer 13 are changed from each other, also, the implantation energy is changed to form the semiconductor layer 3 more deeply than the semiconductor layer 13.

<Embodiment 4>
<Configuration of Device>

Figure 16:
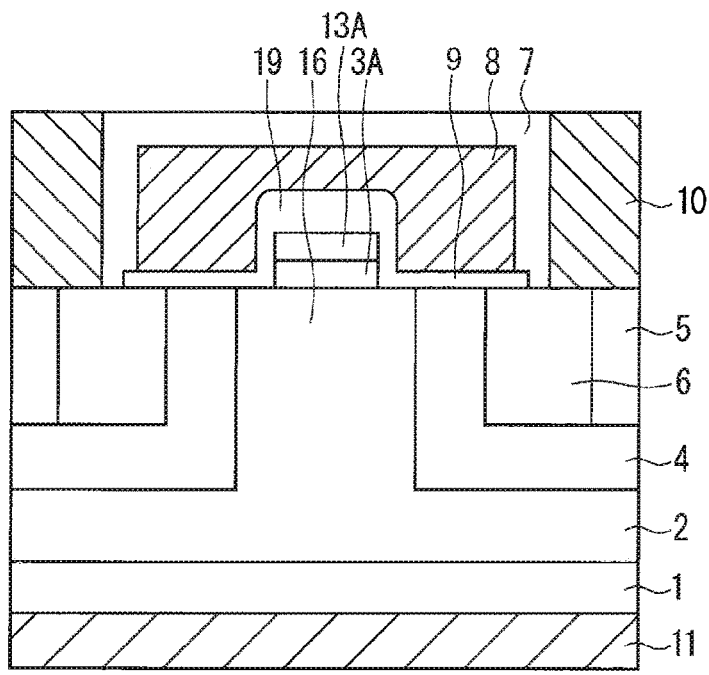
FIG. 16 A cross-sectional view illustrating a configuration of a semiconductor device of Embodiment 4 according to the present invention.

FIG. 16 is a cross-sectional view illustrating a configuration of a semiconductor device of Embodiment 4 according to the present invention. It should be noted that, in FIG. 16, the components that are the same as the SiC-MOSFET 300 described referring to FIG. 14 are denoted by the same reference symbols and overlapping descriptions are omitted.

As illustrated in FIG. 16, in a SiC-MOSFET 400, on one side of a main surface of the semiconductor layer 2 corresponding to the upper JFET region 16, a semiconductor layer 3A (a second semiconductor layer) is formed such that the JFET region 16 is partially covered therewith, and a semiconductor layer 13A (a third semiconductor layer) is formed such that the semiconductor layer 3A is covered therewith. And, the upper surface and the side surfaces of laminated films of the semiconductor layers 3A and 13A are covered by an insulating film 19.

The semiconductor layers 3A and 13A partially covers the JFET region 16, therefore, in the JFET region 16, a portion in which the electric field strength becomes large, is securely protected. Also, when the width of the semiconductor layers 3A and 13A are smaller than the width of the JFET region 16, by providing the gate insulating film 9 above the JFET region 16, the connection resistance between the well region 4 and the semiconductor layer 2 is lowered.

Here, the semiconductor layer 2 is composed of SiC of 4H polytype having a high breakdown electric field, thereby improving a breakdown voltage thereof. Also, polytype silicon carbide that is different from polytype silicon carbide of the semiconductor layer 2 is used for the semiconductor layer 3A, thereby ensuring the production in an integrated film forming process.

That is, when the semiconductor layer 2 is composed of 4H—SiC, and the semiconductor layer 3A is composed of 3C—SiC or 6H—SiC, along with the improvement of the breakdown voltage by the 4H—SiC having a high breakdown electric field, the band offset of the gate insulating film 19 and the semiconductor layer 3A becomes larger than the band offset of the gate insulating film 19 and the semiconductor layer 2.

Accordingly, by covering the JFET region 16 with the semiconductor layer 3A composed of polytype silicon carbide that is different from polytype silicon carbide of the semiconductor layer 2, the band offset of the gate insulating film 19 and a semiconductor interface is increased, also, by controlling the effective mass of electrons or holes with the semiconductor layer 3A, suppression of electrons or holes injected into the gate insulating film 19 above the JFET region 16 is ensured, and control of a current value flowing into the gate insulating film 19 above the JFET region 16 is ensured.

Also, by employing the configuration in which the semiconductor layer 13A covers on the semiconductor layer 3A, a nitride semiconductor AlN, for example, is applicable to the semiconductor layer 13A which has a difficulty in directly growing on the semiconductor layer 2. It should be noted that, although the conductivity type of the semiconductor layer 3A may be either p-type or n-type, the conductivity type of the semiconductor layer 13A is the same conductivity type applied to the semiconductor layer 3A.

In the case where AlN is applied to the semiconductor layer 13, the band offset of the gate insulating film 19 and the semiconductor layer 13 becomes larger than the band offset of the gate insulating film 19 and the semiconductor layer 3, also, by providing the semiconductor layer 13, a selection range of effective mass is further expanded.

Also, on the semiconductor layer 3, in addition to the semiconductor layer 13, a different semiconductor layer may further be formed.

<Modification>

Also in the SiC-MOSFET 400, the semiconductor layers 3A and 13A may be formed by ion implanting the group of IV elements at upper layer parts of the semiconductor layer 2, without using epitaxial growth.

<Embodiment 5>
<Configuration of Device>

Figure 17:
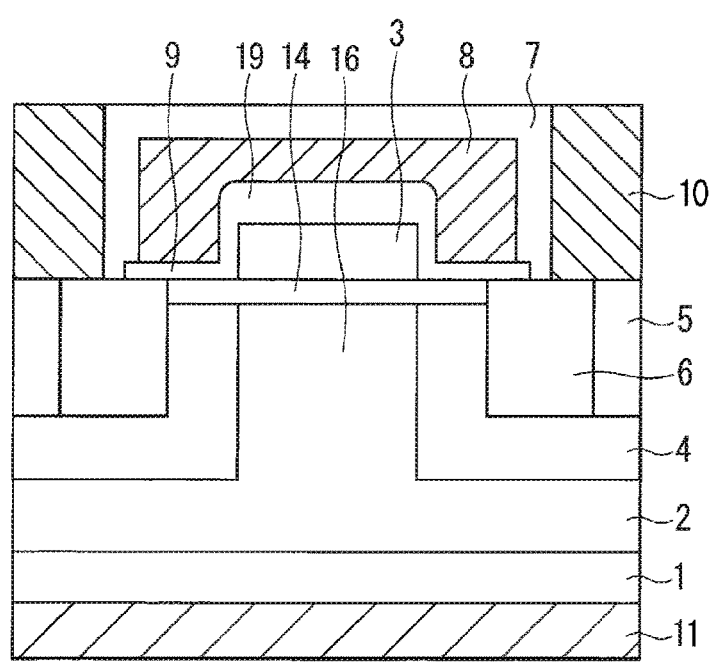
FIG. 17 A cross-sectional view illustrating a configuration of a semiconductor device of Embodiment 5 according to the present invention.

FIG. 17 is a cross-sectional view illustrating a configuration of a semiconductor device of Embodiment 5 according to the present invention. It should be noted that, in FIG. 17, the components that are the same as the SiC-MOSFET 100 described referring to FIG. 1 are denoted by the same reference symbols and overlapping descriptions are omitted.

As illustrated in FIG. 17, in the SiC-MOSFET 500, a channel region 14 (impurity region) is provided from an upper layer part of the JFET region 16 to upper layer parts of the well regions 4, and the semiconductor layer 3 (a second semiconductor layer) is formed such that the channel region 14 within the JFET region 16 is covered therewith.

The conductivity type of the channel region 14 is independently set from the conductivity type of the SiC-MOSFET.

Providing the channel region 14 ensures threshold design for device independently from the well regions 4.

It should be noted that the channel region 14 is also formed below the semiconductor layer 3, however, a channel is not formed in this part, the actual channel is formed in the well regions 4 and the channel region 14 on the above the well regions 4.

Hereinafter, referring to FIGS. 18 to 20, a method of forming the channel region 14 by ion implant is described.

Figure 18:
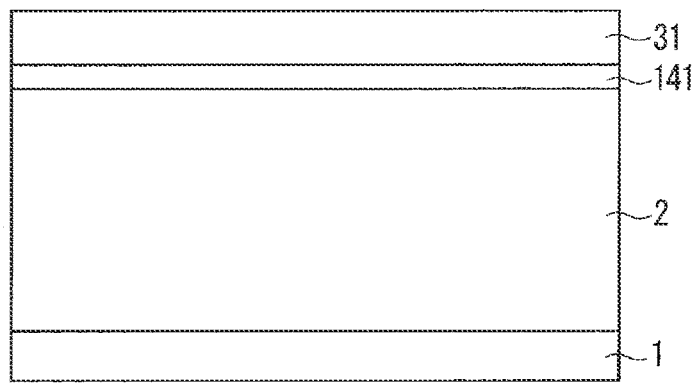
FIG. 18 A cross-sectional view illustrating the manufacturing process of the semiconductor device of Embodiment 5 according to the present invention.

As illustrated in FIG. 18, on the one side of the main surface of the SiC substrate 1, an n-type semiconductor layer 2 is epitaxially grown by CVD for example, thereafter, on the semiconductor layer 2, a semiconductor layer 141 including n-type impurities is formed by epitaxially growth by CVD for example. The semiconductor layer 141 has a thickness of 3 nm to 5 μm, and contains n-type impurities in the range of $1\times10^{13}$ and $5\times10^{18}$ cm$^{-3}$.

Thereafter, on the semiconductor layer 141, an epitaxial layer 31 composed of polytype silicon carbide that is different from polytype silicon carbide of the semiconductor layer 2 is grown by CVD, for example.

Figure 19:
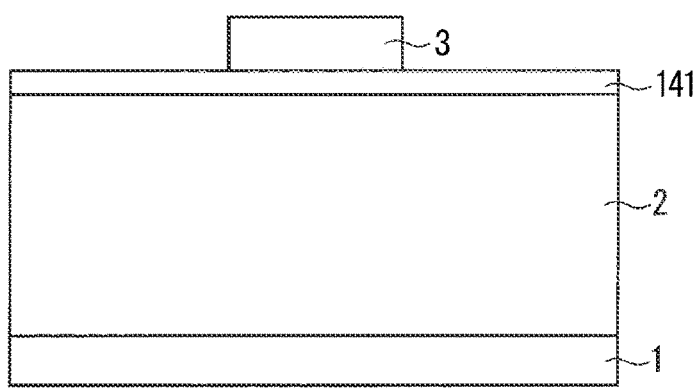
FIG. 19 A cross-sectional view illustrating the manufacturing process of the semiconductor device of Embodiment 5 according to the present invention.

Next, on the epitaxial layer 31, a mask (not shown) having a pattern that covers only a region that is to be the semiconductor layer 3 is formed by a technique of photolithography, by using the mask, the epitaxial layer 31 is selectively removed by etching, thereby, as illustrated in FIG. 19, patterning the semiconductor layer 3 on the semiconductor layer 2. As the mask, a resist mask is used, for example.

Figure 20:
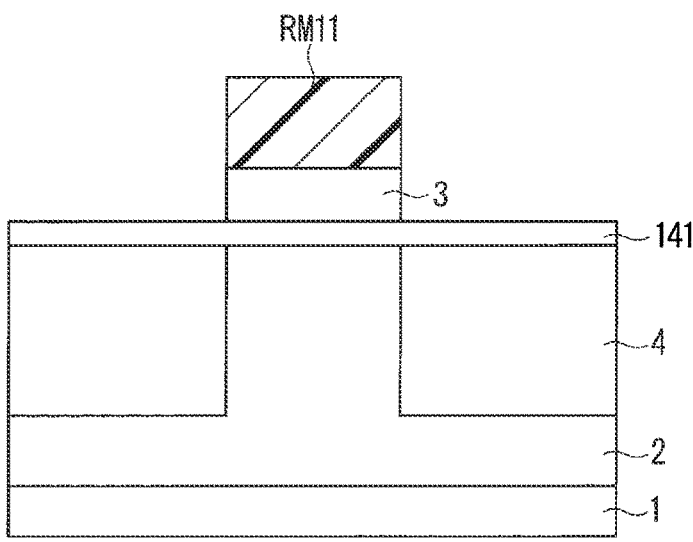
FIG. 20 A cross-sectional view illustrating the manufacturing process of the semiconductor device of Embodiment 5 according to the present invention.

Next, in the step of FIG. 20, a mask RM11 that covers over the semiconductor layer 3 and that has openings so that regions that are to be the well regions 4 become exposed is formed by the technique of photolithography. After the mask RM11 is formed, p-type impurities are ion implanted from above the mask RM11, thereby selectively forming the well regions 4 at upper layer parts of the semiconductor layer 2. Here, the semiconductor layer 141 is an n-type impurity region, therefore, forming the well regions 4 may lower the impurity concentration. Also, forming of the well regions 4 may turn the semiconductor layer 141 into a p-type impurity region. As the mask, a resist mask is used, for example.

Thereafter, as described referring to FIG. 7, a resist mask that covers over the semiconductor layer 3 and that has openings so that regions that are to be the source regions 6 and the well contact regions 5 become exposed is formed by the technique of photolithography, and p-type impurities are ion implanted from above the resist mask, thereby selectively forming the source regions 6 at upper layer parts of the well regions 4 The channel region 14 is to be formed from the upper layer part of the JFET region to the upper layer parts of the well regions 4. The following steps are the same as the steps described referring to FIGS. 8 to 10.

<Application to IGBT>

In Embodiments 1 to 5 described above, the configuration in which the present invention is applied to the SiC-MOSFET is described, however, the application of the present invention is not limited to MOSFET, and the present invention is also applicable to an insulated gate semiconductor device, such as an Insulated Gate Bipolar Transistor (IGBT).

That is, application of the present invention to IGBT including an IGBT unit cell, of which the conductivity type of the SiC substrate 1 illustrated in FIGS. 1, 13, 14, 16, and 17 is p-type (a second conductivity type) also ensures the same effect.

Further, the present invention is also applicable to a freestanding substrate in which the SiC substrate 1 is removed mechanically, chemically, or by other methods, and is configured with only the semiconductor layer 2. In this case, in IGBT, the configuration thereof includes a p-type layer instead of a p-type SiC substrate.

While the invention has been described in detail, the foregoing description is in all aspects illustrative and not restrictive. It is understood that numerous other modifications and variations can be devised without departing from the scope of the invention.

It should be noted that Embodiments and Modification of the present invention can be arbitrarily combined and can be appropriately modified or omitted without departing from the scope of the invention.

The invention claimed is:

1. A semiconductor device, comprising:
   a semiconductor substrate;
   a first semiconductor layer of a first conductivity type, provided on a first main surface of the semiconductor substrate;
   a plurality of first semiconductor regions selectively provided at upper layer parts of the first semiconductor layer, the plurality of first semiconductor regions having a second conductivity type;
   a second semiconductor region selectively provided at an upper layer part of each of the first semiconductor regions, the second semiconductor region having a first conductivity type;
   a second semiconductor layer provided on a JFET region corresponding to the first semiconductor layer between the first semiconductor regions, and configured to cover at least a part of the JFET region;
   a third semiconductor layer provided on the second semiconductor layer;
   a gate insulating film provided such that the first semiconductor regions and the third semiconductor layer are covered therewith;
   a gate electrode provided on the gate insulating film;
   an interlayer insulating film provided such that the gate insulating film and the gate electrode are covered therewith;
   a contact hole penetrating through the gate insulating film and the interlayer insulating film, at least the second semiconductor region being exposed to a bottom part thereof;
   a first main electrode provided on the interlayer insulating film, and configured to electrically connect to the second semiconductor region via the contact hole; and
   a second main electrode provided on a second main surface of the semiconductor substrate,
   the first semiconductor layer being configured of a silicon carbide semiconductor having a first band gap,
   the second semiconductor layer being configured of a semiconductor having a second band gap being narrower than the first band gap, and
   the third semiconductor layer being configured of a semiconductor having a third band gap being narrower than the second band gap.

2. The semiconductor device according to claim 1, further comprising
   an impurity region provided at an upper layer part of each of the first semiconductor regions.

3. The semiconductor device according to claim 1, wherein
   the second semiconductor layer is provided such that the entire JFET region is covered therewith.

4. The semiconductor device according to claim 1, wherein
   the second semiconductor layer is provided such that a part of the JFET region is covered therewith.

5. The semiconductor device according to claim 1, wherein
   a silicon carbide semiconductor included in the first semiconductor layer differs from a silicon carbide semiconductor included in the second semiconductor layer in polytype.

6. The semiconductor device according to claim 5, wherein
   the first semiconductor layer is composed of 4H—SiC.

7. The semiconductor device according to claim 6, wherein
   the second semiconductor layer is composed of 3H—SiC or 6H—SiC.

8. The semiconductor device according to claim 6, wherein
   the second semiconductor layer includes any of additional germanium, silicon, tin, and carbon.

9. The semiconductor device according to claim 1, wherein
   the second semiconductor layer has a thickness of 200 nm or less.

10. The semiconductor device according to claim 1, wherein
    the semiconductor substrate includes a silicon carbide semiconductor of a first conductivity type having the first band gap.

11. The semiconductor device according to claim 1, wherein
    the semiconductor substrate includes a silicon carbide semiconductor of a second conductivity type having the first band gap.

12. A method of manufacturing a semiconductor device including,
    a semiconductor substrate,
    a first semiconductor layer of a first conductivity type, provided on a first main surface of the semiconductor substrate,
    a plurality of first semiconductor regions selectively provided at upper layer parts of the first semiconductor layer, the plurality of first semiconductor regions having a second conductivity type,
    a second semiconductor region selectively provided at an upper layer part of each of the first semiconductor regions, the second semiconductor region having a first conductivity type,
    a second semiconductor layer provided on a JFET region corresponding to the first semiconductor layer between the first semiconductor regions, and configured to cover at least a part of the JFET region,
    a gate insulating film provided such that the first semiconductor regions and the second semiconductor layer are covered therewith,
    a gate electrode provided on the gate insulating film,
    an interlayer insulating film provided such that the gate insulating film and the gate electrode are covered therewith,
    a contact hole penetrating through the gate insulating film and the interlayer insulating film, at least the second semiconductor region being exposed to a bottom part thereof,
    a first main electrode provided on the interlayer insulating film, and configured to electrically connect to the second semiconductor region via the contact hole, and
    a second main electrode provided on a second main surface of the semiconductor substrate,
    wherein the first semiconductor layer is configured of a silicon carbide semiconductor having a first band gap, and
    wherein the second semiconductor layer is configured of a semiconductor having a second band gap being narrower than the first band gap,
    the method comprising the steps of:
    (a) forming the first semiconductor layer of the first conductivity type on the first main surface of the semiconductor substrate by epitaxial growth;

(b) after an epitaxial layer is formed on the first semiconductor layer by epitaxial growth, forming the second semiconductor layer by patterning such that at least the part of the JFET region is covered therewith;

(c) selectively forming the first semiconductor regions of the second conductivity type and the second semiconductor regions of the first conductivity type;

(d) forming the gate insulating film such that the first semiconductor regions and the second semiconductor layer are covered therewith;

(e) forming the gate electrode on the gate insulating film;

(f) forming the interlayer insulating film such that the gate insulating film and the gate electrode are covered therewith;

(g) forming the contact hole penetrating through the gate insulating film and the interlayer insulating film, at least the second semiconductor region being exposed to the bottom part thereof;

(h) forming the first main electrode provided on the interlayer insulating film, and configured to electrically connect to the second semiconductor region via the contact hole; and (i) forming the second main electrode provided on the second main surface of the semiconductor substrate, the step (a) including a step of forming the first semiconductor layer with the silicon carbide semiconductor having the first band gap, and the step (b) including a step of forming the second semiconductor layer with the silicon carbide semiconductor having the second band gap being narrower than the first band gap.

13. A method of manufacturing a semiconductor device including, a semiconductor substrate, a first semiconductor layer of a first conductivity type, provided on a first main surface of the semiconductor substrate, a plurality of first semiconductor regions selectively provided at upper layer parts of the first semiconductor layer, the plurality of first semiconductor regions having a second conductivity type, a second semiconductor region selectively provided at an upper layer part of each of the first semiconductor regions, the second semiconductor region having a first conductivity type, a second semiconductor layer provided on a JFET region corresponding to the first semiconductor layer between the first semiconductor regions, and configured to cover at least a part of the JFET region, a gate insulating film provided such that the first semiconductor regions and the second semiconductor layer are covered therewith, a gate electrode provided on the gate insulating film, an interlayer insulating film provided such that the gate insulating film and the gate electrode are covered therewith, a contact hole penetrating through the gate insulating film and the interlayer insulating film, at least the second semiconductor region being exposed to a bottom part thereof, a first main electrode provided on the interlayer insulating film, and configured to electrically connect to the second semiconductor region via the contact hole, and a second main electrode provided on a second main surface of the semiconductor substrate, wherein the first semiconductor layer is configured of a silicon carbide semiconductor having a first band gap, and wherein the second semiconductor layer is configured of a semiconductor having a second band gap being narrower than the first band gap, the method comprising the steps of:

(a) forming the first semiconductor layer of the first conductivity type on the first main surface of the semiconductor substrate by epitaxial growth;

(b) after an ion implant layer is formed by ion planting any of germanium, silicon, tin, and carbon into the upper layer part of the first semiconductor layer, forming the second semiconductor layer by patterning such that at least the part of the JFET region is covered therewith;

(c) selectively forming the first semiconductor region of the second conductivity type and the second semiconductor region of the first conductivity type;

(d) forming the gate insulating film such that the first semiconductor regions and the second semiconductor layer are covered therewith;

(e) forming the gate electrode on the gate insulating film;

(f) forming the interlayer insulating film such that the gate insulating film and the gate electrode are covered therewith;

(g) forming the contact hole penetrating through the gate insulating film and the interlayer insulating film, at least the second semiconductor region being exposed to the bottom part thereof;

(h) forming the first main electrode provided on the interlayer insulating film, and configured to electrically connect to the second semiconductor region via the contact hole; and (i) forming the second main electrode provided on the second main surface of the semiconductor substrate, the step (a) including a step of forming the first semiconductor layer with the silicon carbide semiconductor having the first band gap, and the step (b) including a step of by the ion implantation, narrowing a band gap of an implanted region, and forming a silicon carbide semiconductor having the second band gap narrower than the first band gap.

* * * * *